(12) United States Patent
Pozzati et al.

(10) Patent No.: US 9,018,941 B2
(45) Date of Patent: Apr. 28, 2015

(54) BIASING CIRCUIT FOR A MAGNETIC FIELD SENSOR, AND CORRESPONDING BIASING METHOD

(75) Inventors: Enrico Pozzati, Cava Manara (IT);
Carlo Alberto Romani, Cornaredo (IT);
Fabio Bottinelli, Malnate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 598 days.

(21) Appl. No.: 13/332,044

(22) Filed: Dec. 20, 2011

(65) Prior Publication Data

US 2012/0153937 A1 Jun. 21, 2012

(30) Foreign Application Priority Data

Dec. 20, 2010 (IT) .............................. TO2010A1019

(51) Int. Cl.
*G01R 35/00* (2006.01)
*G01R 33/09* (2006.01)
*B82Y 25/00* (2011.01)
*G01R 33/00* (2006.01)

(52) U.S. Cl.
CPC ............... *G01R 33/093* (2013.01); *B82Y 25/00* (2013.01); *G01R 33/0023* (2013.01)

(58) Field of Classification Search
None
See application file for complete search history.

(56) References Cited

U.S. PATENT DOCUMENTS

| | | | |
|---|---|---|---|
| 4,847,584 A | 7/1989 | Pant | |
| 5,247,278 A | 9/1993 | Pant et al. | |
| 5,757,184 A * | 5/1998 | Kurihara et al. | 324/244 |
| 6,826,842 B2 * | 12/2004 | Abe et al. | 33/355 R |
| 2005/0145795 A1 | 7/2005 | Wright | |

FOREIGN PATENT DOCUMENTS

DE 102005037036 A1 4/2007

* cited by examiner

*Primary Examiner* — Paresh Patel
(74) *Attorney, Agent, or Firm* — Seed IP Law Group PLLC

(57) ABSTRACT

Described herein is a biasing circuit for a magnetic-field sensor; the magnetic-field sensor is provided with a first detection structure, which generates a first electrical detection quantity as a function of a first component of an external magnetic field, and a second detection structure, which generates a second electrical detection quantity as a function of a second component of an external magnetic field. The biasing circuit electrically supplies the first detection structure and the second detection structure in respective biasing time intervals, at least partially distinct from one another, which preferably do not temporally overlap one other.

22 Claims, 6 Drawing Sheets

BIASING CIRCUIT FOR A MAGNETIC FIELD SENSOR, AND CORRESPONDING BIASING METHOD

BACKGROUND

1. Technical Field

The present disclosure relates to an electrical biasing circuit for a magnetic-field sensor, in particular an anisotropic magnetoresistive (AMR) magnetic sensor, and to a corresponding electrical-biasing method.

2. Description of the Related Art

Magnetic-field sensors, in particular AMR sensors, are used in a plurality of applications and systems, for example in compasses, in systems for detecting ferrous materials, in the detection of currents, and in a wide range of other applications, thanks to their capacity for detecting natural magnetic fields (for example, the Earth's magnetic fields) and magnetic fields generated by electrical components (such as electrical or electronic devices and lines traversed by electric current).

In a known way, the phenomenon of anisotropic magnetoresistivity occurs within particular ferrous materials, which, when subjected to an external magnetic field, undergo a variation of resistivity as a function of the characteristics of the external magnetic field. Usually, these materials are applied in the form of thin strips so as to form magnetoresistive elements, and the magnetoresistive elements thus formed are electrically connected to form a bridge structure (typically a Wheatstone bridge).

Manufacturing of AMR sensors with standard techniques of semiconductor micromachining is also known, as described, for example, in U.S. Pat. No. 4,847,584. In particular, each magnetoresistive element can be formed by a film of magnetoresistive material, such as for example Permalloy (a ferromagnetic alloy containing iron and nickel), deposited to form a thin strip on a substrate of semiconductor material, for example silicon.

When an electric current I is made to flow through a magnetoresistive element (see FIG. 1a), the angle θ between the direction of magnetization M of the magnetoresistive element and the direction of flow of the electric current I affects the effective value of resistivity of the magnetoresistive element, so that, as the value of the angle θ varies, the value of electrical resistance also varies (in detail, this variation follows a law of the $\cos^2\theta$ type). The magnetoresistive elements are generally brought into an initial condition of magnetization, via appropriate biasing means; next, an external magnetic field $H_e$ causes a variation of the direction of magnetization M of the magnetoresistive elements (and a variation of the value of angle θ), and consequently a variation of resistance. In particular, it is the component of the external magnetic field $H_e$ perpendicular to the direction of magnetization M, acting along the so-called axis of sensitivity or detection, that affects the value of the angle θ.

The Wheatstone-bridge detection structure of an AMR sensor includes magnetoresistive elements that have ideally the same value of resistance and are such as to form diagonal pairs of equal elements, which react in a way opposite with respect to one another to the external magnetic fields, as shown schematically in FIG. 1b (where I is once again the electric current flowing in the magnetoresistive elements and R is the common resistance value). If a supply (or electrical biasing) voltage $V_{ss}$ is applied at input to the bridge detection structure (in particular to first two terminals of the bridge, operating as input terminals), in the presence of an external magnetic field $H_e$, a resistance variation ΔR of the magnetoresistive elements and a corresponding variation of the value of voltage drop on the magnetoresistive elements occur. There follows an unbalancing of the bridge, causing a voltage variation ΔV at output (in particular between the remaining two terminals of the bridge, operating as output terminals). Given that the initial direction of magnetization of the magnetoresistive elements is known beforehand, as a function of this voltage variation ΔV it is possible to determine the component of the external magnetic field acting along the axis of sensitivity of the detection structure.

In particular, in order to detect the unbalancing of the Wheatstone bridge and generate an electrical output signal indicating the characteristics of the external magnetic field to be measured, a reading circuit (or front-end) is normally used, which is coupled to the output of the detection structure of the AMR sensor and includes a signal-conditioning stage, comprising amplification and filtering units, and possibly an analog-to-digital-converter stage, which supplies to the outside the output signals.

A measurement technique proposed and widely used moreover envisages the use of coils or straps, which are integrated in the same AMR sensors, and are designed to generate, when traversed by current, a magnetic field with pre-defined direction and sense; these coils are known as "set/reset straps". For example, the set/reset straps are provided on the same substrate as that on which the magnetoresistive elements of the sensor are provided, being electrically insulated from, and set in the proximity of, the magnetoresistive elements.

During operation, the initial orientation of the magnetization direction is obtained by applying to the magnetoresistive elements, via the set/reset straps, an intense magnetic field for a short period of time, of a value such as to force and align the orientation of the magnetic dipoles of the magnetoresistive element in a first pre-defined direction (in the case of a "set" pulse) of a magnetization axis (the so-called "easy axis"), or else in a second pre-defined direction, opposite to the first direction (in the case of a "reset" pulse) along the same magnetization axis, according to the sense of the magnetic field generated, and hence in a way coherent with the sense of the current that circulates in the same set/reset straps. The aforementioned set and reset operations are known and described in detail, for example, in U.S. Pat. No. 5,247,278.

The reversal of orientation of the magnetic dipoles causes inversion of sign of the signal at output from the Wheatstone bridge, in the presence of an external magnetic field $H_e$. Instead, any possible offset signals superimposed on the useful signal in the output signal do not reverse their own polarity, since they are due exclusively to mismatch between the components internal to the sensor and are hence independent of the characteristics of the external magnetic field $H_e$.

Consequently, the measuring procedure envisages applying a set pulse and, after waiting an appropriate relaxation time such as to eliminate possible current tails and allow settling of the magnetic dipoles of the ferromagnetic material, acquiring a first sample of the output signal (for example, a voltage signal, Vout) in the presence of the external magnetic field $H_e$; the first sample of the output signal, designated by $Vout_{set}$ is given by:

$$Vout_{set} = H_e \cdot S + Vout_{off}$$

where S is the sensitivity of the magnetic sensor and $Vout_{off}$ the offset signal superimposed on the output.

Next, a reset pulse is applied and, after waiting an appropriate relaxation time such as to eliminate possible current tails and allow settling of the magnetic dipoles of the ferromagnetic material, a second sample of the output signal is acquired, to obtain:

$$Vout_{reset} = H_e \cdot (-S) + Vout_{off}$$

where −S is the value of sensitivity of the magnetic sensor, having in this case a value equal and opposite to the value of sensitivity S during the set operation, on account of the reversal of sense of the magnetic dipoles of the magnetoresistive elements of the sensor.

A subtraction is then made between the first sample and the second sample that have been acquired, which makes it possible to derive the useful signal, cancelling out the effects of the offset contribution on the output signal, as follows:

$$(Vout_{set} - Vout_{reset}) = H_e \cdot S + Vout_{off} - (H_e \cdot (-S) + Vout_{off}) = 2H_e \cdot S$$

Moreover known to the art is the joint use of three Wheatstone-bridge detection structures, each constituted by appropriately oriented magnetoresistive elements, having axes of sensitivity orthogonal to one another, for determining the magnitude and direction of an external magnetic field acting in any direction of space (thus determining the corresponding components along the three axes of sensitivity). This configuration is used, for example, in the manufacturing of compasses or magnetometers, for example in mobile-phone devices or in other mobile devices.

In this kind of applications, the magnetic sensor hence comprises, as a whole, three detection structures, each corresponding to a respective axis of sensitivity, x, y or z, and moreover a biasing and reading circuit, typically provided as application-specific integrated circuit (ASIC), configured so as to detect and process the electrical signals supplied by the various detection structures, and supply an appropriate biasing voltage to the same detection structures, during the entire operation of the magnetic-sensor device (the biasing voltage, see FIG. 1b, is used for supplying the Wheatstone bridge and determining unbalancing thereof in the presence of external fields).

Also due to the low values of electrical resistance of the various magnetoresistive elements constituting the detection structures, the consumption of each Wheatstone-bridge detection structure is rather high (even of the order of some milliamps). In addition, the same reading circuit, which comprises amplifiers and in general active electronic components, has considerable consumption levels, which adds to the consumption associated to the detection structures, determining as a whole a considerable energy expenditure. The energy consumption is still higher in the case where a number of reading circuits, which operate in parallel, are used, each coupled to a respective detection structure; a solution of this sort moreover entails a considerable increase in the area occupation for the integrated implementation.

The problem of electrical consumption of magnetic sensors is hence particularly felt, especially in applications in which a number of detection structures is used for detecting components of magnetic fields oriented along respective axes of sensitivity. This problem, of course, is even more important in applications in which the energy usage represent a determining design constraint, such as, for example, in battery-supplied portable applications.

BRIEF SUMMARY

The aim of the present disclosure is consequently to provide a magnetic-field sensor having a low energy consumption in order to solve, or at least limit, the problem previously highlighted.

According to the present disclosure, a biasing circuit for a magnetic-field sensor, and a corresponding biasing method, are provided, as defined in the annexed claims.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

Figure 1A:
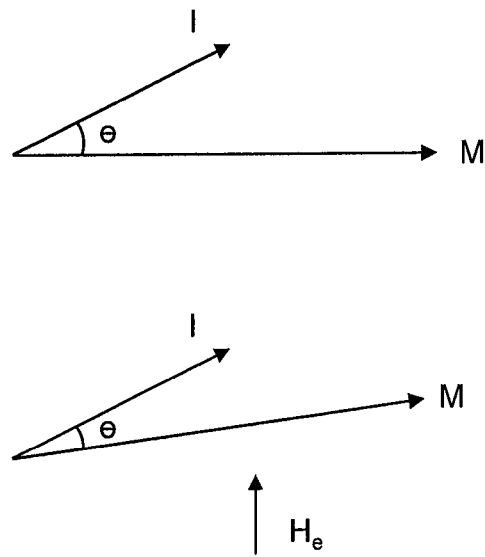
FIG. 1a shows a diagram regarding physical quantities associated to a magnetoresistive element, of a known type.
Figure 1B:
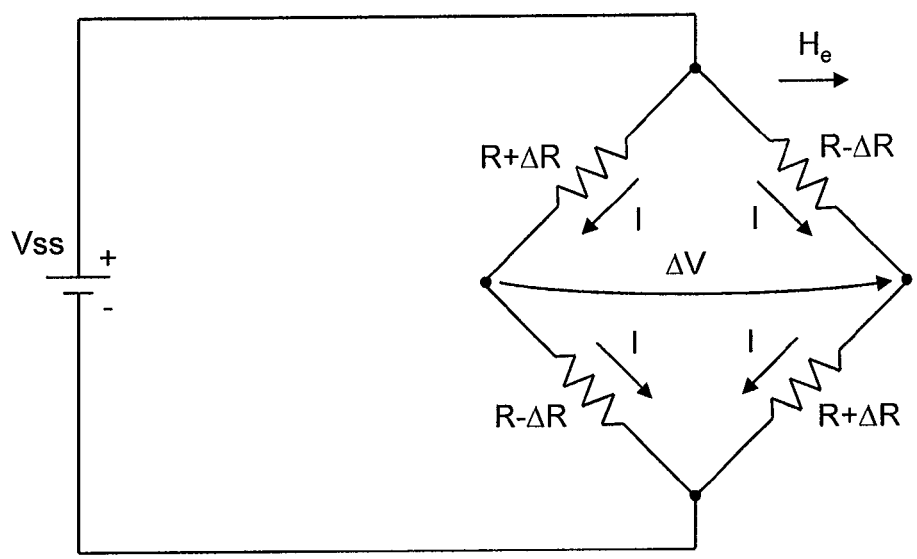
FIG. 1b shows a simplified equivalent electrical diagram of a detection structure of an AMR sensor, of a known type.

One aspect of the present disclosure applies to a magnetic-field sensor, in particular an AMR sensor, having at least a first detection structure and a second detection structure, for example of the type described with reference to FIGS. 1a, 1b, each of which corresponds to a respective axis of sensitivity and is able to detect a respective component of an external magnetic field, and envisages implementation of a biasing circuit configured so as to supply the various detection structures in times at least in part distinct and not overlapping. In this way, each detection structure is usually supplied in a respective biasing time interval, during which reading of the corresponding output signals is performed (and it is not supplied outside the same biasing time interval), thus obtaining a considerable reduction of the overall energy consumption of the magnetic sensor.

A further aspect of the disclosure moreover envisages implementing a reading circuit, which comprises a single reading chain (or front-end), configured so as to be operatively coupled, in times at least in part distinct and not overlapping, to the various detection structures of the magnetic sensor, in particular corresponding to the respective biasing time intervals of the same detection structures.

Figure 2:
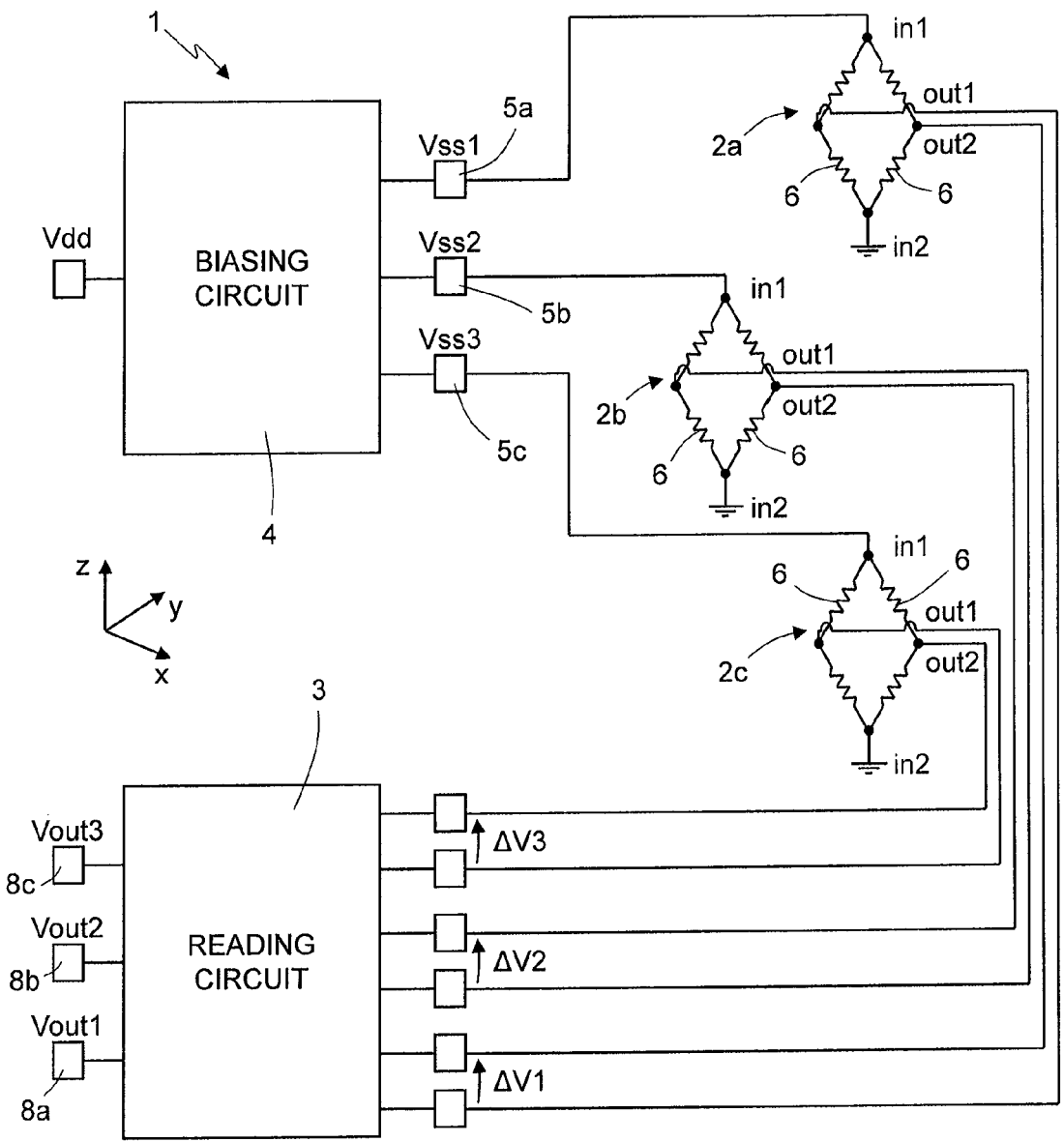
FIG. 2 shows a simplified diagram of a reading and biasing electronic circuit of a magnetic-field sensor, in particular an AMR sensor, according to one embodiment of the present disclosure.

FIG. 2 shows a block diagram of a magnetic-field sensor (in particular an AMR sensor), designated as a whole by 1, of a triaxial type, which includes: a first detection structure, designated by 2a and shown schematically by means of the corresponding Wheatstone-bridge equivalent circuit, having a first sensitivity axis x (i.e., capable of detecting the component of an external field directed along the first sensitivity axis x); and a second detection structure and a third detection structure, designated by 2b and 2c, having a second and a third sensitivity axis z, y, respectively. The three sensitivity axes x, y, and z are orthogonal to one another. The sensitivity axes x and y are so-called horizontal axes, and lie in a plane parallel to the main surface of the die in which the corresponding detection structures are provided, whereas the second sensitivity axis z is a vertical axis perpendicular to the horizontal axes x and y, and hence perpendicular to the main surface of the same die.

The magnetic-field sensor 1 further comprises: a reading circuit or front-end 3, electrically coupled to the detection structures 2a-2c; and a biasing circuit 4, which is also electrically coupled to the same detection structures 2a-2c.

As will be described more fully hereinafter, the reading front-end 3 and the biasing circuit 4 form together an electronic circuit electrically coupled to the detection structures 2a-2c, advantageously provided as an ASIC.

The biasing circuit 4 has at output a first biasing pad 5a, a second biasing pad 5b, and a third biasing pad 5c, which are distinct from one another and on which it supplies, respectively, a first biasing signal $V_{ss1}$, a second biasing signal $V_{ss2}$, and a third biasing signal $V_{ss3}$ (for example electrical voltage signals).

Figure 3:
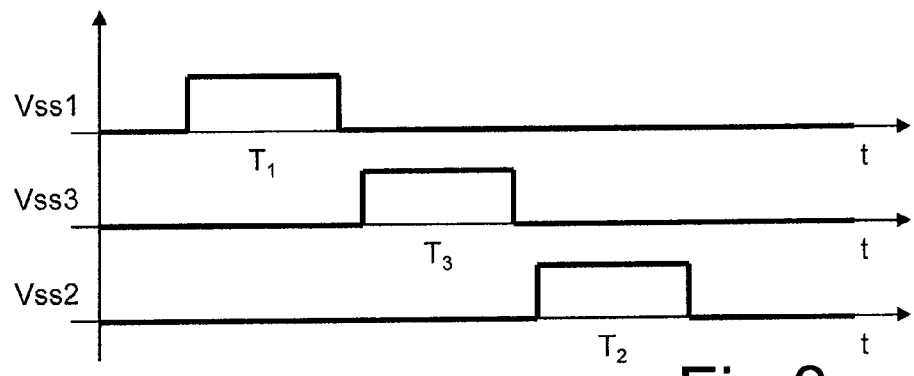
FIG. 3 shows a timing diagram of biasing signals in the magnetic-field sensor of FIG. 2.

According to one aspect of the present disclosure, and as illustrated in FIG. 3, the biasing signals $V_{ss1}$, $V_{ss2}$, $V_{ss3}$ are temporally offset from one another in such a way as not to overlap in time.

For example, the biasing signals $V_{ss1}$, $V_{ss2}$, $V_{ss3}$ are constituted by rectangular pulses having a same duration and a same amplitude value, each pulse acting in a respective biasing time interval, distinct from the others (these intervals are designated by T1, T2 and T3 in FIG. 3). The biasing signals $V_{ss1}$, $V_{ss2}$, $V_{ss3}$ are moreover repeated periodically (in a way not illustrated in FIG. 3), at a given reading frequency (for example equal to 220 Hz), thus having in each period a given amplitude value within the respective biasing time interval, and being zero outside the same biasing interval.

In the example illustrated in FIG. 3, within each period (or reading cycle) first the first detection structure 2a (corresponding to the first sensitivity axis x) is supplied, then the third detection structure 2c (corresponding to the third sensitivity axis y), and afterwards the second detection structure 2b (corresponding to the second sensitivity axis z). In this example, it is also provided a non-zero waiting time interval between two successive pulses corresponding to two biasing signals $V_{ss1}$, $V_{ss2}$, $V_{ss3}$ that are contiguous in time with respect to one another (however, this waiting time may possibly not be present, i.e., be equal to zero).

In greater detail (see FIG. 2), each detection structure 2a-2c, in Wheatstone-bridge configuration, comprises four magnetoresistive elements 6, for example constituted by strips of a thin film of magnetoresistive material, such as Permalloy, which have a same value of resistance at rest R (in the absence of external magnetic fields), and are designed to undergo in pairs a same variation ΔR in the presence of an external magnetic field $H_e$ (the pairs are formed by the elements facing in diagonal in the bridge).

Each detection structure 2a-2c has: a first input terminal $In_1$, designed to be connected to a respective biasing pad 5a-5c so as to receive the respective biasing signal $V_{ss1}$, $V_{ss2}$, $V_{ss3}$; and a second input terminal $In_2$, designed to be connected to a reference terminal (for example, a ground terminal of the electronic circuit).

Each detection structure 2a-2c moreover has a respective first output terminal $Out_1$ and a respective second output terminal $Out_2$, present across which is a respective electrical unbalancing signal (i.e., a voltage variation, designated respectively by ΔV1, ΔV2, and ΔV3), which is a function of the characteristics of the external magnetic field $H_e$ that is to be detected, and in particular of the component of the same external magnetic field $H_e$ acting along the respective sensitivity axis x, z, y.

The reading front-end 3 receives at input the voltage variations ΔV1, ΔV2, and ΔV3, and processes them appropriately to supply a first output signal Vout1, a second output signal Vout2, and a third output signal Vout3, which correspond, respectively, to the first, second, and third sensitivity axis x, z and y, on a first output 8a, a second output 8b, and a third output 8c, respectively.

In particular, according to one aspect of the present disclosure, the reading front-end 3 is configured so as to process the voltage variations ΔV1, ΔV2, and ΔV3 received at input, each in the respective biasing time interval during which the associated detection structure 2a-2c is supplied.

It is evident that this electronic biasing and reading circuit enables a considerable reduction of the levels of energy consumption associated to the magnetic-field sensor 1, given that it envisages electrically supplying in temporally distinct intervals the various detection structures 2a-2c, instead of simultaneously supplying the same detection structures 2a-2c during the entire period of operation of the magnetic-field sensor 1.

Figure 4:
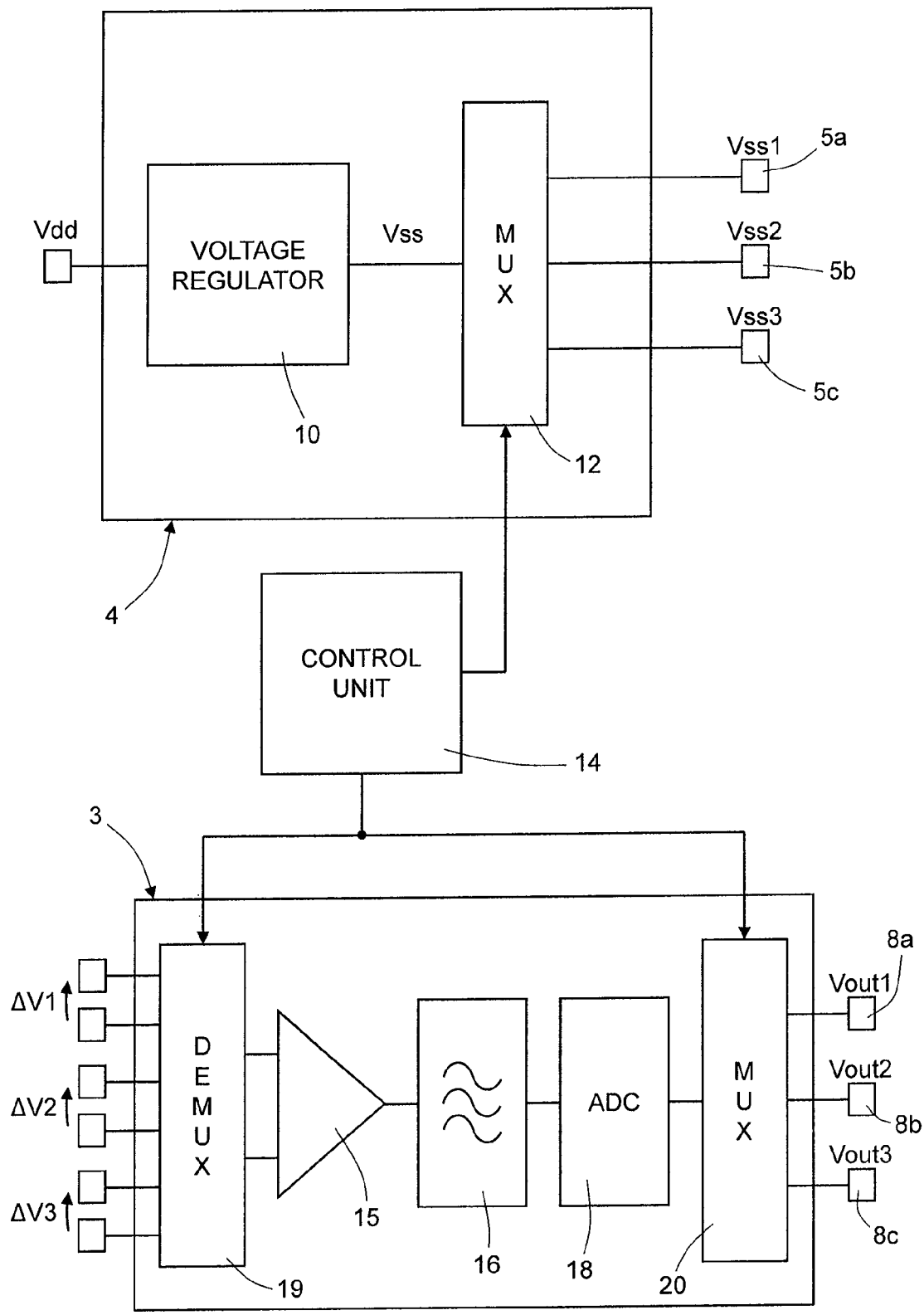
FIG. 4 shows in greater detail a possible embodiment of the electronic circuit of FIG. 2.

FIG. 4 shows in greater detail a possible implementation of the reading and biasing electronic circuit of the magnetic-field sensor 1.

The biasing circuit 4 here comprises a voltage regulator 10, having: an input, which receives from outside of the magnetic-field sensor 1 a supply voltage $V_{dd}$, for example comprised between 2.1 V and 3.6 V (in particular equal to 2.4 V), from a supply source, for example a battery supply source, of an electronic device in which the magnetic-field sensor 1 is incorporated, for example a mobile phone; and an output, which supplies a biasing voltage $V_{ss}$, of a regulated and stable value, for example equal to 1.8 V. The voltage regulator 10 may have any circuit structure, of a per-se known type, here not described in detail.

The biasing circuit 4 further comprises a first switching stage 12, including a multiplexer, having an input, which receives the biasing voltage $V_{ss}$, and a first output, a second output, and a third output, which are connected, respectively, to the first, second, and third biasing pads 5a, 5b, 5c. The first switching stage 12 receives appropriate control signals, for example from a control unit 14 associated with the reading and biasing electronic circuit of the magnetic-field sensor 1, so as to supply in temporally distinct intervals the biasing voltage $V_{ss}$ to the various outputs and to the respective biasing pads 5a-5c and thus establish on the same biasing pads 5a-5c the respective biasing signals $V_{ss1}$, $V_{ss2}$ and $V_{ss3}$. In particular, the control unit 14, for example including a microprocessor, a microcontroller, a programmable-logic unit, or a similar computing tool, controls the first switching stage 12 in such a way that the biasing voltage $V_{ss}$ reaches the various biasing pads 5a-5c, in the respective biasing time intervals of the associated detection structures 2a-2c (so as to obtain, for example, the pattern for the biasing signals $V_{ss1}$, $V_{ss2}$ and $V_{ss3}$ illustrated in FIG. 3).

Alternatively, suitable control signals for the first switching stage 12 can be received from outside the magnetic-field sensor 1, for example from a management unit of an electronic device in which the magnetic-field sensor 1 is incorporated.

The reading front-end 3 comprises a single reading chain including in a known way: an amplification stage 15, designed to be electrically coupled in a selective manner to the outputs of the detection structures 2a-2c; and a filtering stage 16, cascaded to the amplification stage 15. The reading circuit further comprises at output an analog-to-digital-converter (ADC) stage 18, cascaded to the filtering stage 16.

The reading front-end 3 comprises a second switching stage 19, including a demultiplexer, having three pairs of inputs, each pair being connected to the output terminals $Out_1$, $Out_2$ of a respective detection structure 2a-2c, and a pair of outputs, connected to differential inputs of the amplification stage 15.

The second switching stage 19 receives appropriate control signals from the control unit 14 so as to send selectively to the amplification stage 15 the voltage variations $\Delta V1$, $\Delta V2$, and $\Delta V3$, during the biasing time intervals of the respective detection structures 2a-2c, and thus enable reading thereof when the same detection structures 2a-2c are effectively supplied. The control unit 14 hence acts so as to synchronize switching of the first and second switching stages 12, 19.

The reading front-end 3 further comprises a third switching stage 20, including a multiplexer, synchronized, via control signals received from the control unit 14, with the first and second switching stages 12, 19, so as to send at output the first, second, and third output signals Vout1, Vout2, and Vout3, on the first, second, and third outputs 8a-8c, respectively. The third switching stage 20 has one input, connected to the output of the ADC stage 18, and three outputs, each connected to a respective output 8a-8c of the reading front-end 3.

In a way not illustrated, the reading front-end 3 may supply to the outside of the magnetic-field sensor 1, appropriate analog signals, as an alternative or in addition to the output signals of a digital type. In particular, in the case of a digital implementation, respective registers may be associated to the outputs 8a-8c; respective contact pads may instead be associated with the same outputs 8a-8c, in the case of an analog implementation (where the ADC stage 18 is not present, and the switching stage 20 is of an analog type).

Figure 5:
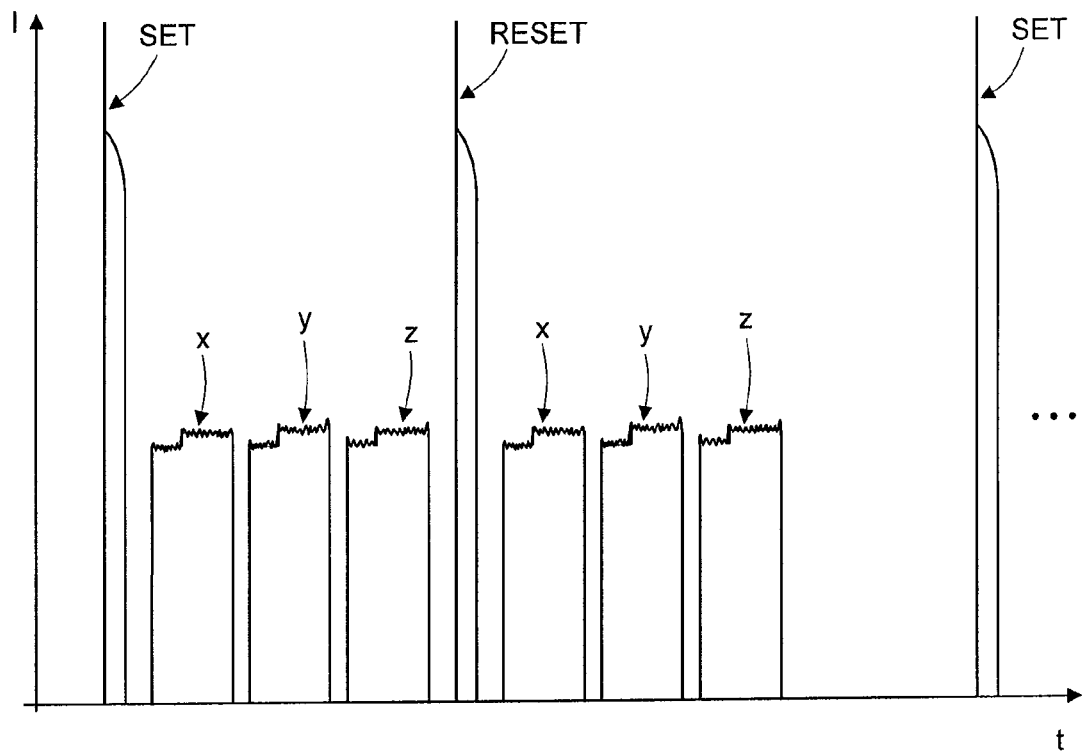
FIG. 5 shows a diagram which refers to the current consumption of the magnetic-field sensor of FIG. 2.

FIG. 5 shows a diagram representing the current consumption of the magnetic-field sensor 1 during a reading cycle, which, in the example, comprises a set reading phase and a reset reading phase (this reading scheme advantageously enables compensation of possible offsets on the signals detected by the various detection structures 2a-2c; see in this regard the foregoing discussion). Reading cycles, as illustrated only partially in FIG. 5, are repeated periodically, at a given reading frequency, for example equal to 220 Hz.

The reading cycle starts with the application of a set pulse to the set/reset straps integrated in the magnetic-field sensor 1 (in a known way; see the foregoing discussion); this operation causes an impulsive current consumption.

After waiting a time sufficient for recharging of the capacitive elements used (in a known way, here not described in detail) for generation of the set pulse (and of the subsequent reset pulse, described hereinafter), and after waiting a time sufficient for extinction of each current transient and for magnetic settling of the dipoles, the first detection structure 2a, in the example corresponding to the first sensitivity axis x, is supplied for the respective biasing time interval, so as to enable reading of the component of the external field $H_e$ directed along the same first sensitivity axis x. Next, in a temporally distinct manner, the third, and then the second, detection structures 2c, 2b are supplied so as to enable reading of the respective electrical output signals corresponding to the third and second sensitivity axes y and z.

It should be noted that, within each biasing time interval, a slight increase in the current consumption occurs at turning-on of the ADC stage 18 of the reading front-end 3 (as shown by the step that may be seen in the waveform of the absorbed current). The ADC stage 18, in order to optimize the energy consumption and increase energy saving, is in fact activated only after the filtering stage 16 is in a steady-state condition.

Next, a reset pulse is applied, and, in a substantially similar way, the reading operations of the various detection structures are repeated in succession, thus concluding a reading cycle. There follows a waiting period, in which there does not occur substantially any current consumption (except for the current associated with a counter defining the reading periodic timing, which is also optimized for reduced consumption), and then a new reading cycle is performed, and the sequence is repeated periodically.

From examination of FIG. 5, it hence emerges clearly that, advantageously, the current consumption, during the reading operations, is limited, as regards the magnetoresistive elements, to the consumption of a single detection structure 2a-2c, and in particular of the corresponding Wheatstone-bridge circuit.

Figure 6:
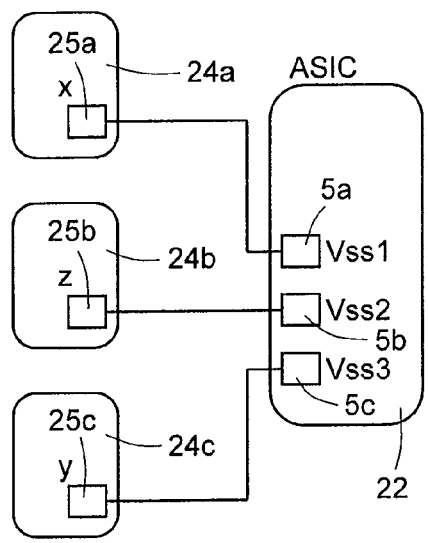
FIGS. 6, 7, and 8 show simplified block diagrams of possible embodiments of the magnetic-field sensor.

From the manufacturing standpoint, as shown schematically in FIG. 6, it is advantageous to manufacture, with techniques of semiconductor micromachining, the reading and biasing electronic circuit, including amongst other elements the reading front-end 3, the biasing circuit 4, and possibly the control unit 14, as a single ASIC, integrated in a first die of semiconductor material 22, carrying, on a surface accessible from the outside, the biasing pads 5a-5c.

Each detection structure 2a-2c can be provided in a respective die 24a-24c of semiconductor material, each carrying, on a respective outer surface, a respective input pad 25a-25c designed to be electrically coupled to a corresponding biasing pad 5a-5c, for receiving the respective biasing signal $V_{ss1}$, $V_{ss2}$ or $V_{ss3}$. The dice 22 and 24a-24c can moreover be housed in single package so as to form a single chip for the magnetic-field sensor 1.

Figure 7:
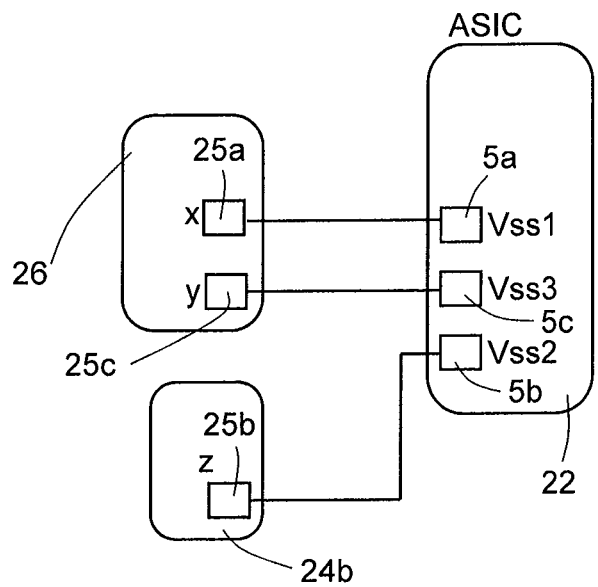
Figure 8:
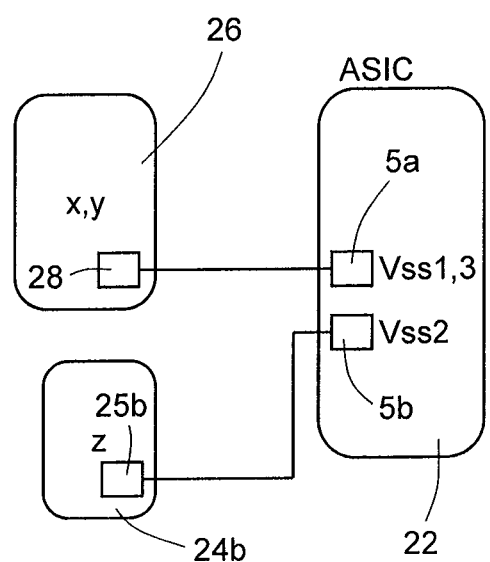

Alternatively, as illustrated schematically in FIGS. 7 and 8, for manufacturing reasons (and for reasons of arrangement of the various magnetoresistive elements 6) it may be advantageous to integrate in a single die 26 the detection structures 2a, 2c corresponding to the horizontal sensitivity axes x, y, i.e., corresponding to the axes belonging to a plane parallel to a main surface of the die 26, and separately integrate in a further die, designated once again by 24b, the detection structure 2b corresponding to the vertical sensitivity axis (second sensitivity axis z).

In this embodiment, the possibility may once again be envisaged of supplying in a separate and temporally distinct manner the first and third detection structures 2a, 2c integrated in the same die 26 (as illustrated in FIG. 7); alternatively (as illustrated in FIG. 8), the possibility may be envisaged of supplying jointly in a common biasing interval both the first detection structure 2a and the third detection structure 2c (still supplying in a distinct biasing time interval the second detection structure 2b via the second biasing signal $V_{ss2}$).

In the latter case, the presence is thus envisaged, on a single biasing pad, designated by 5a, of a single biasing signal, designated by $V_{ss1,3}$, for joint biasing of the first and third detection structures 2a, 2c (the die 26 carrying in this case a single input pad, designated by 28).

This solution entails an advantage in terms of manufacturing simplicity and smaller area occupation (amongst other advantages, given the presence of a single input pad in common for the first and third detection structures 2a, 2c, for enabling biasing thereof), at the expense, however, of an increase in the energy consumption during the reading cycles (due to joint biasing of two bridge detection structures).

Figure 9:
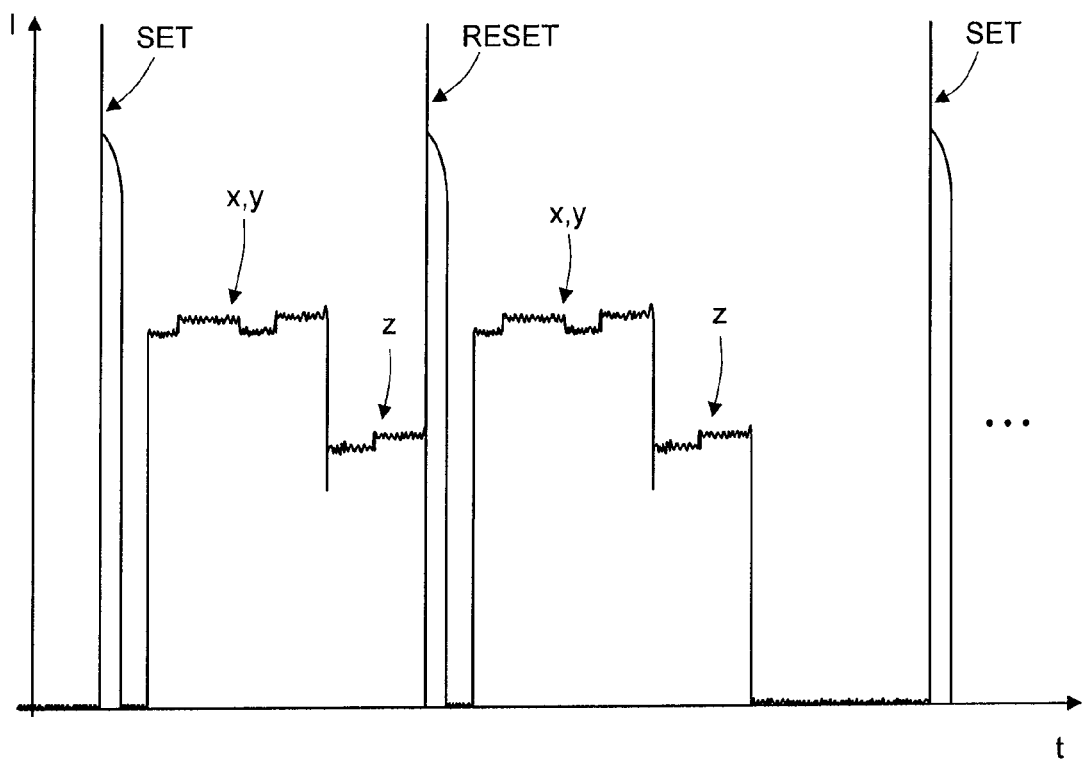
FIG. 9 shows a diagram which refers to the current consumption of the magnetic-field sensor, in a different embodiment thereof.

As illustrated in FIG. 9, which regards this same embodiment, during the reading interval of the first and third detection structures 2a, 2c a higher current consumption indeed occurs (due to the need of supplying simultaneously a pair of detection structures) as compared to the current consumption that would be obtained with a single detection structure. It should be noted that, in the example illustrated in FIG. 9, there is not envisaged a waiting time interval between the biasing pulse, in common to the first biasing structure 2a and to the third biasing structure 2a, 2c, and the biasing pulse for the second biasing structure 2b.

Figure 10:
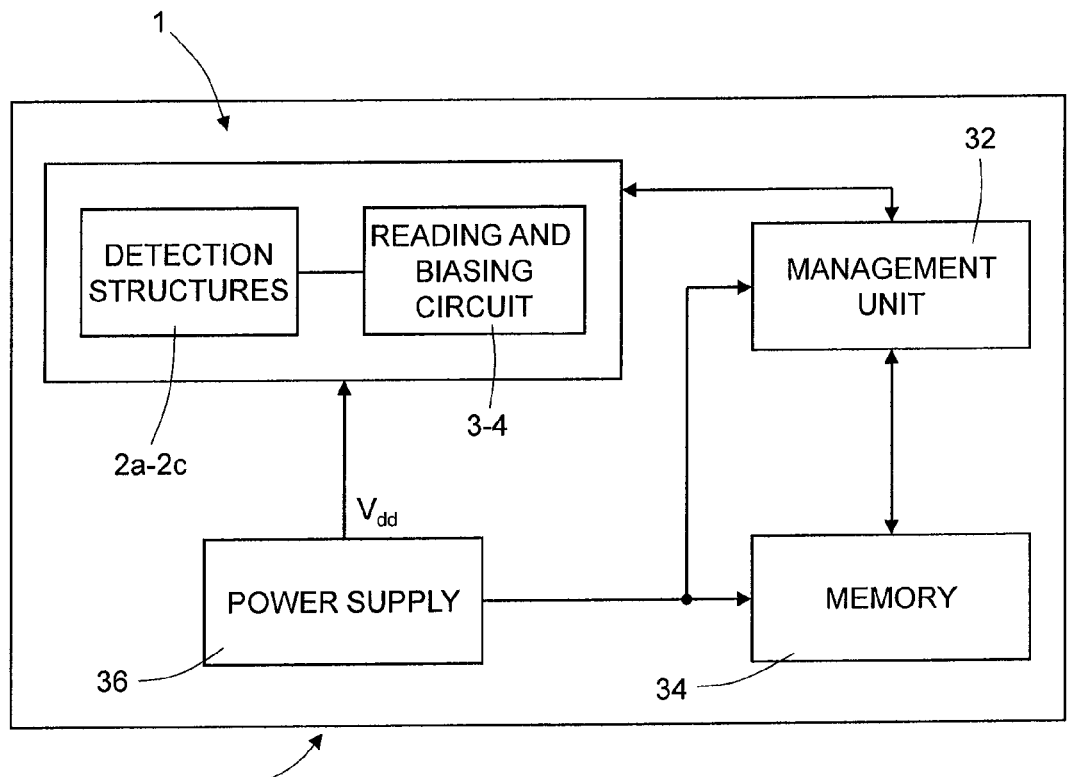
FIG. 10 shows a simplified block diagram of an electronic device incorporating the magnetic-field sensor.

FIG. 10 shows a block diagram of an electronic device 30, for example a mobile phone or a similar portable electronic device, in which the magnetic-field sensor 1, and in particular the corresponding detection structures 2a-2c and the corresponding reading and biasing circuits 3, 4, are used, for example with functions of compass or magnetometer.

The electronic device 30 comprises a management unit (for example, including a microprocessor) 32, connected to the reading front-end 3 of the magnetic-field sensor 1, in particular for controlling the operations of the reading front-end 3, and for acquiring and possibly carrying out further processing on the output signals Vout1-Vout3 supplied (in analog or digital format) by the reading front-end 3. In a way not illustrated, the management unit 32 can moreover be configured so as to co-operate with a user interface of the electronic device 30.

The electronic device 30 further comprises a memory 34 (optional), and a supply source 36, connected to the magnetic-field sensor 1, to the management unit 32, and to the memory 34, for providing the supply signals required for their operation; the supply source 36 may comprise, for example, a battery, which supplies the aforesaid supply voltage $V_{dd}$ for the magnetic-field sensor 1.

The electronic device 30 may further comprise a position-detection system, for example including an accelerometer, configured for detecting the orientation of the electronic device with respect to the surface of the Earth.

The advantages of the biasing circuit and of the biasing method according to the present disclosure, and of the corresponding magnetic-field sensor, emerge clearly from the foregoing description.

In particular, the described biasing scheme affords a considerable reduction of the current consumption associated to the magnetic-field sensor 1. For example, in the case of a triaxial sensor, the consumption associated to the magnetoresistive elements alone can even come to be substantially equal to one third of what would be required in the case where the detection structures were supplied simultaneously during the entire reading cycle. Considering that the consumption associated to the Wheatstone-bridge detection structures can constitute even 50% of the overall consumption of the magnetic-field sensor 1, it may be understood that a considerable energy saving may be obtained with the described solution.

In addition, use of a single reading front-end, associated in time-sharing fashion to the various detection structures 2a-2c (during the respective biasing time intervals), enables a further saving of energy, and moreover a saving in the area occupation in the integrated implementation of the magnetic-field sensor 1.

Finally, it is clear that modifications and variations may be made to what has been described and illustrated herein, without thereby departing from the scope of the present disclosure.

In particular, it is evident that the use of the described biasing circuit is advantageous also in the case where the magnetic-field sensor, for example of a biaxial type, comprises even only two detection structures, for example having sensitivity axes x and y. Also in this case, it is in fact advantageous to supply the two detection structures in distinct time intervals.

The structure of the reading and biasing circuits 3, 4 can differ from the one illustrated and described; for example, the switching stages may comprise appropriate controlled switching elements, in order to selectively supply, in the respective biasing time intervals, the various detection structures 2a-2c. In addition, further biasing pads may possibly be provided, at output from the biasing circuit 4, for biasing the second input terminal $In_2$ of each detection structure 2a-2c (in the case where the same terminal is not connected to a ground terminal of the circuit).

In particular, the biasing circuit 4 may not comprise the voltage regulator 10, in the case where the supply voltage $V_{dd}$ is used directly for biasing the Wheatstone-bridge detection structures 2a-2c (possibly already stabilized outside the magnetic-field sensor 1). The supply voltage $V_{dd}$, which coincides in this case with the biasing voltage $V_{ss}$, is again supplied in at least partially distinct times to the various detection structures, for example by using the first switching stage 12.

The various biasing signals $V_{ss1}$, $V_{ss2}$, $V_{ss3}$ may possibly have a partial temporal overlapping, each biasing signal having in any case at least one portion that does not temporally overlap the other biasing signals.

The circuit according to the present disclosure may also be used for further types of magnetic-field sensors, in general for the realization, for example, of compasses and magnetometers; in particular, one or more of the various detection structures may possibly be of a different type, for example including Hall-effect detection means.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit for a magnetic-field sensor that includes a first detection structure configured to detect a first directional component of an external magnetic field and a second detection structure configured to detect a second directional component of said external magnetic field, the circuit comprising:
a biasing circuit configured to electrically supply said first detection structure during a first biasing time interval and to electrically supply said second detection structure during a second biasing time interval, the first and second bias time intervals being at least partially distinct from one another in that the bias circuit is configured to electrically supply said first detection structure without electrically supplying said second detection structure during at least a portion of the first bias time interval and is configured to electrically supply said second detection structure without electrically supplying said first detection structure during at least a portion of the second bias time interval, wherein said biasing circuit is configured to electrically supply a third detection structure of the magnetic field sensor during a third biasing time interval to enable the third detection structure to detect a third directional component of the external magnetic field, the first, second, and third biasing time intervals being at least partially distinct from one another.

2. The circuit according to claim 1, wherein said respective biasing time intervals are not temporally overlapping.

3. The circuit according to claim 1, wherein said biasing circuit is configured to electrically supply a first biasing signal and a second biasing signal to said first detection structure and said second detection structure, respectively; said first biasing signal and said second biasing signals including respective pulses that are temporally offset and have a duration equal to the respective biasing time intervals.

4. The circuit according to claim 1, wherein said biasing circuit is configured to electrically supply jointly said first detection structure and a third detection structure of the magnetic field sensor during the first biasing time interval to enable the third detection structure to detect a third directional component while the first detection structure detects the first directional component.

5. The circuit according to claim 1, comprising:
a first electrical-biasing pad and a second electrical-biasing pad configured to be electrically coupled respectively to said first and second detection structures; and
a first switching stage having an input configured to receive a biasing voltage, the first switching stage being configured to selectively connect said first and second electrical-biasing pads to said input in said first and second biasing time intervals, respectively, and disconnect said first and second electrical-biasing pads from said input outside of said first and second biasing time intervals, respectively.

6. The circuit according to claim 5, further comprising a voltage-regulator stage configured to receive a supply voltage and to generate said biasing voltage, having a stable and regulated value, based on said supply voltage.

7. A circuit for a magnetic-field sensor that includes a first detection structure configured to detect a first directional component of an external magnetic field and a second detection structure configured to detect a second directional component of said external magnetic field, the circuit comprising:
a biasing circuit configured to electrically supply said first detection structure during a first biasing time interval and to electrically supply said second detection structure during a second biasing time interval, the first and second bias time intervals being at least partially distinct from one another in that the bias circuit is configured to electrically supply said first detection structure without electrically supplying said second detection structure during at least a portion of the first bias time interval and is configured to electrically supply said second detection structure without electrically supplying said first detection structure during at least a portion of the second bias time interval; and
a reading circuit including a single signal-conditioning stage configured to be electrically coupled, selectively and alternately, to said first detection structure during the first biasing time interval and to said second detection structure in said second biasing time interval, and configured to generate a first output signal and a second output signal as a function, respectively, of a first electrical detection quantity and a second electrical detection quantity output by the first and second detection structures, respectively.

8. The circuit according to claim 7, wherein said biasing circuit is configured to electrically supply a third detection structure of the magnetic field sensor during a third biasing time interval to enable the third detection structure to detect a third directional component of the external magnetic field, the first, second, and third biasing time intervals being at least partially distinct from one another.

9. The circuit according to claim 8, wherein:
said biasing circuit includes:
a first electrical-biasing pad and a second electrical-biasing pad, configured to be electrically connected, respectively, to said first detection structure and to said second detection structure, and
a first switching stage having an input configured to receive a biasing voltage, the first switching stage being configured to selectively connect said first and second electrical-biasing pads to said input in said first and second biasing time intervals, respectively; and
said reading circuit comprises a second switching stage configured to electrically couple in a selective manner said signal-conditioning stage to said first and second detection structures.

10. The circuit according to claim 9, further comprising a control unit configured to control said first and second switching stages in a synchronized manner.

11. A magnetic-field sensor, comprising:
a first detection structure, which, in operation, detects a first directional component of an external magnetic field;
a second detection structure, which, in operation, detects a second directional component of said external magnetic field;
a biasing circuit, which, in operation, electrically supplies said first detection structure during a first biasing time interval and electrically supplies said second detection structure during a second biasing time interval, the first and second bias time intervals being at least partially distinct from one another; and
a reading circuit including a single signal-conditioning stage, which, in operation, is electrically coupled, selectively and alternately, to said first detection structure during the first biasing time interval and to said second detection structure in said second biasing time interval, and generates a first output signal and a second output signal as a function, respectively, of a first electrical detection quantity and a second electrical detection quantity output by the first and second detection structures, respectively.

12. The magnetic-field sensor according to claim 11, wherein said respective biasing time intervals are not temporally overlapping.

13. The magnetic field sensor according to claim 11, wherein:
said first detection structure and said second detection structure comprise respective bridge circuits of magnetoresistive elements; and
said biasing circuit, in operation, electrically supplies a first biasing signal and a second biasing signal to said first detection structure and said second detection structure, respectively, said first biasing signal and said second biasing signals including respective pulses that are temporally offset and have a duration equal to the respective biasing time intervals.

14. The magnetic-field sensor according to claim 11, comprising:
a first electrical-biasing pad and a second electrical-biasing pad electrically coupled respectively to said first and second detection structures; and
a first switching stage having an input to receive a biasing voltage, the first switching stage, in operation, selectively connects said first and second electrical-biasing pads to said input in said first and second biasing time intervals, respectively, and disconnects said first and second electrical-biasing pads from said input outside of said first and second biasing time intervals, respectively.

15. The magnetic-field sensor according to claim 11 wherein:
said biasing circuit includes:
a first electrical-biasing pad and a second electrical-biasing pad, electrically connected, respectively, to said first detection structure and to said second detection structure, and
a first switching stage having an input to receive a biasing voltage, the first switching stage, in operation, selectively connects said first and second electrical-biasing pads to said input in said first and second biasing time intervals, respectively; and
said reading circuit comprises a second switching stage, which, in operation, electrically couples in a selective manner said signal-conditioning stage to said first and second detection structures.

16. The magnetic-field sensor according to claim 15, comprising control circuitry, which, in operation, controls said first and second switching stages in a synchronized manner.

17. The magnetic-field sensor according to claim 11 wherein said biasing circuit and said reading circuit are integrated in a first die of semiconductor material, said first detection structure is integrated in a second die of semiconductor material, and said second detection structure is integrated in a third die of semiconductor material, the second and third dies carrying respective input pads electrically coupled to said first die.

18. An electronic device comprising:
a magnetic-field sensor that includes:
a first detection structure configured to detect a first directional component of an external magnetic field;
a second detection structure configured to detect a second directional component of said external magnetic field; and
a biasing circuit configured to electrically supply said first detection structure during a first biasing time interval and to electrically supply said second detection structure during a second biasing time interval, the first and second bias time intervals being at least partially distinct from one another in that the bias circuit is configured to electrically supply said first detection structure without electrically supplying said second detection structure during at least a portion of the first bias time interval and is configured to electrically supply said second detection structure without electrically supplying said first detection structure during at least a portion of the second bias time interval; and
a management unit coupled to said magnetic-field sensor, wherein the magnetic-field sensor includes a reading circuit including a single signal-conditioning stage configured to be electrically coupled, selectively and alternately, to said first detection structure during the first biasing time interval and to said second detection structure in said second biasing time interval, and is configured to generate a first output signal and a second output signal as a function, respectively, of a first electrical detection quantity and a second electrical detection quantity output by the first and second detection structures, respectively.

19. The device according to claim 18, wherein the magnetic-field sensor includes:
a first electrical-biasing pad and a second electrical-biasing pad configured to be electrically coupled respectively to said first and second detection structures; and
a first switching stage having an input configured to receive a biasing voltage, the first switching stage being configured to selectively connect said first and second electrical-biasing pads to said input in said first and second biasing time intervals, respectively, and disconnect said first and second electrical-biasing pads from said input outside of said first and second biasing time intervals, respectively.

20. The device according to claim 18, wherein:
said biasing circuit includes:
a first electrical-biasing pad and a second electrical-biasing pad, configured to be electrically connected, respectively, to said first detection structure and to said second detection structure, and
a first switching stage having an input configured to receive a biasing voltage, the first switching stage being configured to selectively connect said first and second electrical-biasing pads to said input in said first and second biasing time intervals, respectively; and
said reading circuit comprises a second switching stage configured to electrically couple in a selective manner said signal-conditioning stage to said first and second detection structures.

21. A method, comprising:
biasing a magnetic-field sensor that includes a first detection structure configured to generate a first electrical detection quantity as a function of a first directional component of an external magnetic field, and a second detection structure configured to generate a second electrical detection quantity as a function of a second directional component of the external magnetic field, the biasing including:
electrically supplying said first detection structure and said second detection structure in first and second biasing time intervals, respectively, which are at least partially distinct from one another, the supplying including supplying said first detection structure without supply the second detection structure during at least a portion of the first bias time interval and supplying the second detection structure without supplying the first detection structure during at least a portion of the second bias time interval, wherein said magnetic-field sensor comprises a third detection structure configured to generate a third electrical detection quantity as a function of a third directional component of an external magnetic field, said first, second, and third components of said external magnetic field being directed along respective sensitivity axes, orthogonal to one another, of said magnetic-field sensor; said method comprising electrically supplying said third detection structure in a third biasing time interval that is at least partially distinct from the first and second time intervals.

22. The method according to claim 21, wherein said first and second biasing time intervals are not temporally overlapping.

* * * * *

UNITED STATES PATENT AND TRADEMARK OFFICE
CERTIFICATE OF CORRECTION

PATENT NO.        : 9,018,941 B2                           Page 1 of 1
APPLICATION NO.   : 13/332044
DATED             : April 28, 2015
INVENTOR(S)       : Enrico Pozzati et al.

It is certified that error appears in the above-identified patent and that said Letters Patent is hereby corrected as shown below:

Claims

Column 12, Line 9, Claim 9:
"9. The circuit according to claim 8, wherein:" should read as --9. The circuit according to claim 7, wherein:--.

Signed and Sealed this
Thirteenth Day of October, 2015

Michelle K. Lee
*Director of the United States Patent and Trademark Office*